(12) United States Patent
Johnson (10) Patent No.: US 10,352,978 B2
(45) Date of Patent: Jul. 16, 2019

(54) DEVICE, SYSTEM AND METHOD FOR WIRELESSLY TESTING TRAILER BRAKE CONTROL UNIT

(71) Applicant: Nissan North America, Inc., Franklin, TN (US)

(72) Inventor: Steven R Johnson, Lascassas, TN (US)

(73) Assignee: Nissan North America, Inc., Franklin, TN (US)

( * ) Notice: Subject to any disclaimer, the term of this patent is extended or adjusted under 35 U.S.C. 154(b) by 56 days.

(21) Appl. No.: 15/086,661

(22) Filed: Mar. 31, 2016

(65) Prior Publication Data

US 2017/0285084 A1 Oct. 5, 2017

(51) Int. Cl.
*G01R 31/00* (2006.01)
*G07C 5/08* (2006.01)

(52) U.S. Cl.
CPC ......... *G01R 31/007* (2013.01); *G07C 5/0808* (2013.01); *G07C 5/0825* (2013.01); *G07C 2205/02* (2013.01)

(58) Field of Classification Search
CPC .. G01R 31/005–008; G01R 31/02–043; B60T 7/12–22; B60T 17/22; G01L 5/28–288; B60Q 1/30–307
See application file for complete search history.

(56) References Cited

U.S. PATENT DOCUMENTS

| 4,547,722 | A | * | 10/1985 | Sarlo | B60Q 11/005 324/504 |
| 8,704,650 | B1 | * | 4/2014 | Perten | B60Q 1/305 280/DIG. 14 |
| 8,816,691 | B2 | | 8/2014 | Miller et al. | |
| 8,816,697 | B2 | | 8/2014 | Miller et al. | |
| 9,501,877 | B2 | * | 11/2016 | Andrus | G07C 5/0808 |
| 2006/0236704 | A1 | * | 10/2006 | Valcavi | G01R 31/007 62/129 |
| 2006/0279291 | A1 | * | 12/2006 | Fielding | G01R 1/04 324/503 |
| 2007/0069734 | A1 | * | 3/2007 | Bertness | G01R 31/007 324/411 |
| 2007/0244660 | A1 | * | 10/2007 | Bertness | G01R 31/007 702/108 |
| 2007/0285100 | A1 | * | 12/2007 | Hart | B60T 8/885 324/504 |
| 2008/0309156 | A1 | * | 12/2008 | Kissel | B60T 7/20 303/20 |
| 2009/0009304 | A1 | * | 1/2009 | Lacasse | G01R 31/006 340/431 |
| 2009/0212784 | A1 | * | 8/2009 | Kilian | G01R 31/44 324/504 |

(Continued)

*Primary Examiner* — Huy Q Phan
*Assistant Examiner* — David B Frederiksen
(74) *Attorney, Agent, or Firm* — Global IP Counselors, LLP (57) ABSTRACT

A wireless testing device includes a trailer connector portion including a plurality of inputs; a communication device; a plurality of loads each connected to one of the plurality of inputs; and a control device. The plurality of inputs is configured to connect to a plurality of circuits in a vehicle. The control device is configured to determine the operability of each of the plurality of circuits in the vehicle when the trailer connector portion is connected to the vehicle by applying each of the plurality of loads to one of the plurality of inputs.

19 Claims, 12 Drawing Sheets

(56) References Cited

U.S. PATENT DOCUMENTS

| | | | |
|---|---|---|---|
| 2009/0219148 A1* | 9/2009 | Thomas | B60R 16/0315 340/431 |
| 2010/0085172 A1* | 4/2010 | Ancuta | B60T 17/22 340/431 |
| 2011/0265025 A1* | 10/2011 | Bertness | G01R 31/006 715/771 |
| 2012/0010779 A1* | 1/2012 | Staufer | B60T 7/20 701/32.8 |
| 2012/0146653 A1* | 6/2012 | Rybolt | G01R 31/44 324/504 |
| 2012/0245792 A1* | 9/2012 | Langlais | G01F 23/0007 701/34.4 |
| 2013/0308327 A1* | 11/2013 | Piccioni | B60D 1/64 362/485 |
| 2015/0066322 A1 | 3/2015 | Squire et al. | |
| 2015/0362544 A1* | 12/2015 | Bean | B60Q 1/305 324/503 |
| 2016/0054365 A1* | 2/2016 | Cooper | G01R 31/006 324/504 |
| 2016/0121792 A1* | 5/2016 | Christopherson | B60D 1/64 340/431 |
| 2016/0291095 A1* | 10/2016 | Bell | G01R 31/42 |

* cited by examiner

DEVICE, SYSTEM AND METHOD FOR WIRELESSLY TESTING TRAILER BRAKE CONTROL UNIT

BACKGROUND

Field of the Invention

The present invention generally relates to a device, system and method for wirelessly testing a trailer brake control unit in a vehicle. More specifically, the present invention relates to a wireless testing device including a trailer connection portion and a control device configured to test the operability of the circuits of a vehicle when the trailer connector portion is connected to the vehicle.

Background Information

Vehicles that are configured to tow a trailer are also commonly configured for electrical coupling to the trailer. For example, trailers are commonly configured to couple with the lighting system of the vehicle such that the exterior lights of the trailer correspond to the exterior indicator lights of the vehicle. In this manner, a wiring harness or other electrical connection may be used to electrically couple a trailer light to a corresponding vehicle light such that the trailer light is actuated when the corresponding vehicle light is actuated.

Methods for checking the trailer light system are known. For example, U.S. Pat. Nos. 8,816,691 B2 and 8,816,697 B2 disclose trailer light checking systems in which the lighting control system is configured to check the connection between the vehicle lights and the trailer lights by simulating the manual operation of each of the exterior vehicle lights such that a respective trailer light will actuate in combination with the simulated manual operation of each of the exterior vehicle lights if the system is functioning correctly.

Trailer brake control units are devices or modules that are either installed or integrated into the vehicle. Trailer brake control units allow a driver to control the braking of the trailer, typically on a time delay from the vehicle brakes or in proportion to the vehicle's braking when slowing down or coming to a stop.

Brake control testers that check the wiring and operation of the trailer brake control unit are known. For example, there are seven way testers that plug into a trailer plug on a rear bumper of a truck or SUV and check the operation of the trailer lights and the electric brake controller. These seven way testers may also confirm that the vehicle has the proper 12 V power supply for the operation of the trailer brake control unit.

SUMMARY

It has been discovered that in order to check the wiring and operation of the trailer brake control unit, two people are needed—one at the rear of the vehicle where the tester is plugged in to verify the correct operation of the circuits in the vehicle, and one inside the vehicle operating the trailer brake control unit. It would be desirable to provide a system and method of testing a trailer brake control unit wirelessly such that it is possible for a single person to test and confirm correct operation of the trailer brake control unit.

In view of the state of the known technology, one aspect of the present disclosure is to provide a wireless testing device including a trailer connector portion including a plurality of inputs configured to connect to a plurality of circuits in a vehicle; a communication device; a plurality of loads each connected to one of the plurality of inputs, and a control device. The control device is configured to determine the operability of each of the plurality of circuits in the vehicle when the trailer connector portion is connected to the vehicle by applying each of the plurality of loads to one of the plurality of inputs.

Another aspect of the present disclosure is to provide a wireless trailer testing system for a vehicle. The wireless trailer testing system includes a tester configured to connect to an on-board diagnostic system of the vehicle and a wireless testing device. The wireless testing device includes a trailer connector portion comprising a plurality of inputs configured to connect to a plurality of circuits in a vehicle; a communication device configured to communicate wirelessly with the tester; a plurality of loads each connected to one of the plurality of inputs; and a control device. The control device is configured to determine the operability of each of the plurality of circuits in the vehicle when the trailer connector portion is connected to the vehicle by applying each of the plurality of loads to one of the plurality of inputs. The control device is configured to apply each of the plurality of loads connected to one of the plurality of inputs based on a command received from the tester.

A further aspect of the present disclosure is to provide a method for testing a trailer brake control unit of a vehicle. The method includes connecting a wireless testing device to a plurality of circuits in the vehicle; connecting a tester to an on-board diagnostic system of the vehicle; and determining the operability of each of the plurality of circuits in the vehicle when the trailer connector portion is connected to the vehicle based on instructions from the tester. The wireless testing device includes a trailer connector portion comprising a plurality of inputs configured to connect to a plurality of circuits in the vehicle; a communication device configured to communicate wirelessly with the tester; a plurality of loads each connected to one of the plurality of inputs; and a control device configured to determine the operability of each of the plurality of circuits in the vehicle when the trailer connector portion is connected to the vehicle by applying each of the plurality of loads to one of the plurality of inputs. The control device is configured to apply each of the plurality of loads connected to one of the plurality of inputs based on a command received from the tester.

Thus, the wireless testing device described herein is able to communicate with a portable test unit to confirm that the wiring in the trailer braking control unit is working correctly, thereby allowing a single person to test the trailer braking control unit of the vehicle on the assembly line.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
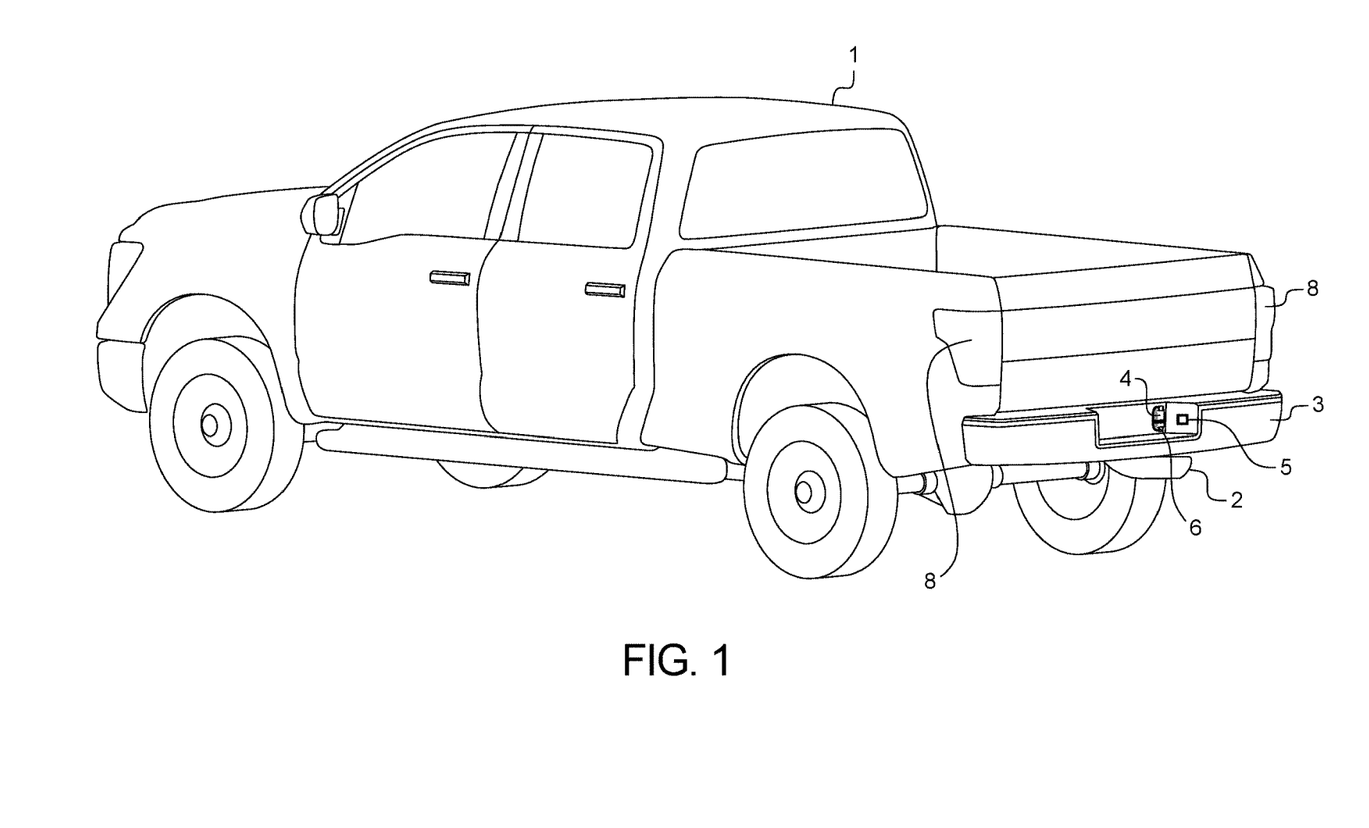
FIG. 1 is a rear perspective view of a vehicle including a wiring connector on a rear bumper.

Referring initially to FIG. 1, a vehicle 1 can be configured for towing a trailer. Although FIG. 1 shows the vehicle 1 as a truck, the term "vehicle" as used herein generally refers to a vehicle or other road going or off-road vehicle that can be configured for towing a trailer. The term "trailer" as used herein generally refers to any vehicle that can be couple to and towed by the vehicle 1. For example, the trailer may be a common recreational vehicle, a boat trailer, a utility trailer, a stock trailer or any other type of trailer. The trailer may be mechanically coupled to the vehicle 1 using a hitch 2 or any other mechanical coupling such as a tow bar, or any other standard or custom coupling.

Figure 2:
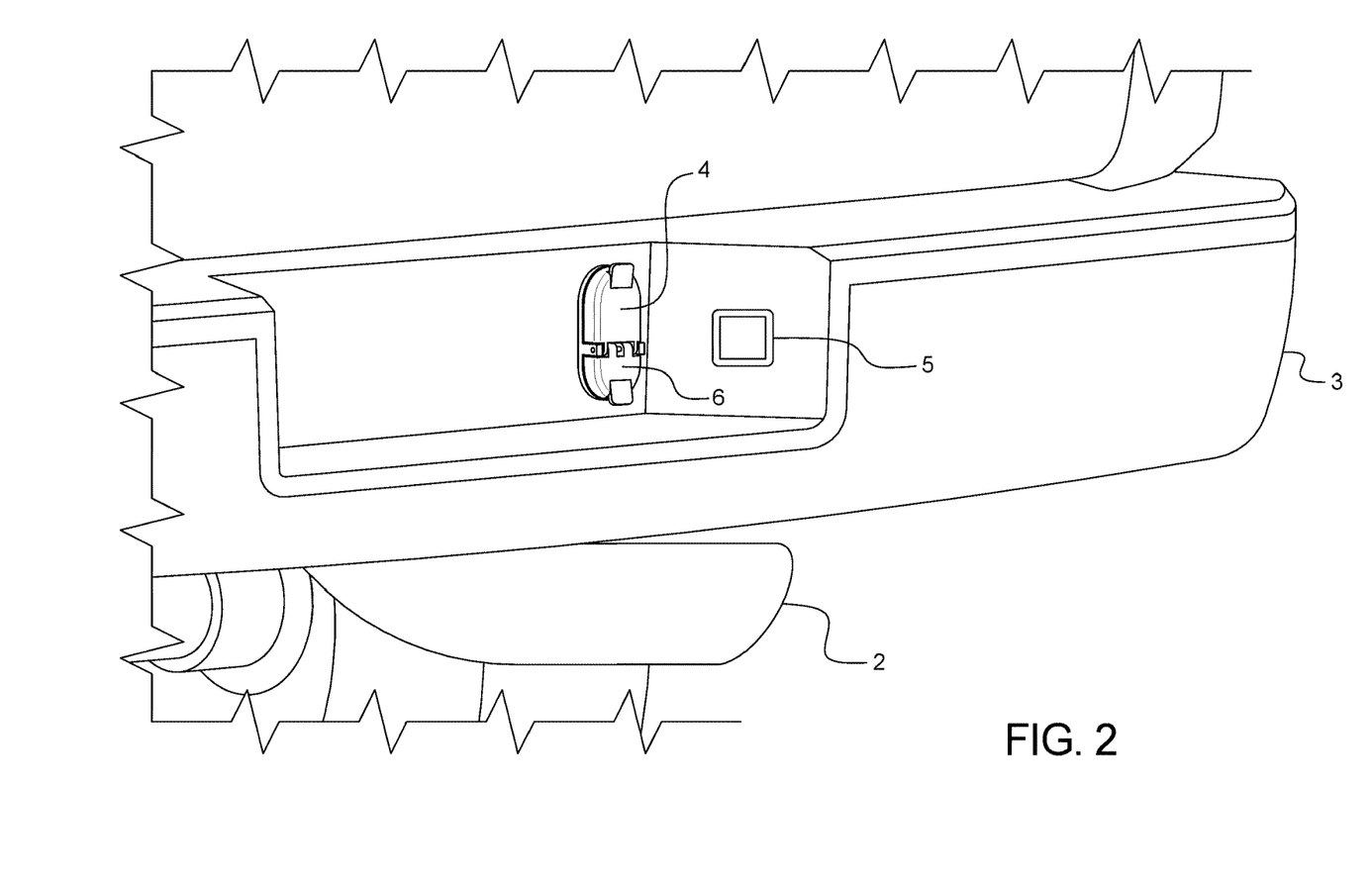
FIG. 2 is a rear perspective view of the wiring connector and rear bumper shown FIG. 1.
Figure 3A:
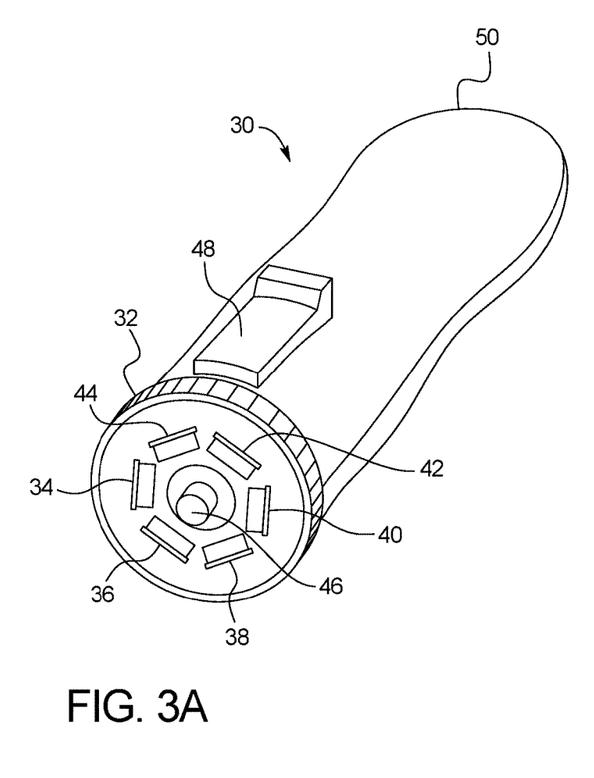
FIG. 3A is a front elevational view of the wiring connector shown in FIG. 1
Figure 3B:
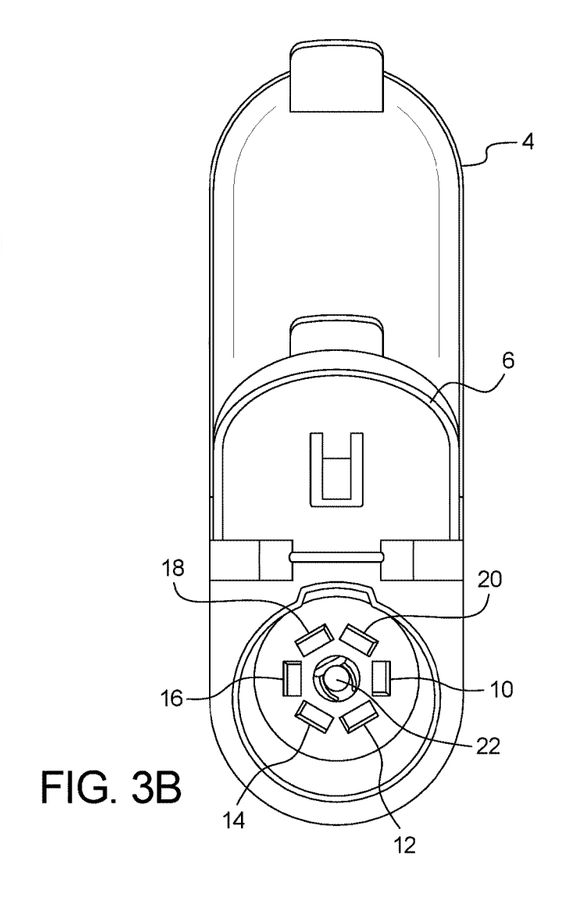
FIG. 3B is a top perspective view of a wireless testing device configured to connect to the wiring connector according to an embodiment.

The trailer may also be electrically connected to the vehicle 1 using a connector plug 4 on the rear bumper 3 of the vehicle. The rear bumper 3 also includes a license plate light 5 on the left and right sides of the license plate to illuminate the license plate. As shown in FIGS. 1-3, the plug 4 may be accessed by opening a plug cover 6.

The vehicle 1 and the trailer can both have lights, including for example lights for communicating driving intentions, safety lights, accessory lights and/or convenience lights. In particular, the vehicle 1 can include several exterior lights 8, such as headlights, a left turn indicator light, a right turn indicator light, a brake indicator light, a backup indicator light, tail lights, or a running light. The trailer can also include trailer lights, and some or all of the trailer lights may correspond to one or more of the exterior vehicle lights 8.

The vehicle 1 can also include a trailer brake control unit 214 for controlling application of power to the electric brakes of the trailer. The trailer brake control unit 214 may be integrated into the console 213 of vehicle 1. However, it will be apparent to those skilled in the art from this disclosure that the trailer brake control unit 214 may be mounted to the console 213 or may be otherwise provided at any suitable location within the vehicle 1. The trailer brake control unit 214 controls a 250 Hz pulse-width modulated signal. The duty cycle of the 250 Hz pulse-width modulated signal in turn determines the aggressiveness with which power is supplied by the vehicle 1 to the trailer brakes. The duty cycle may be controlled using a slide lever 216 or up/down buttons 218 provided on the trailer brake control unit 214. However, it will be apparent to those skilled in the art that any suitable device, such as buttons, may be used to adjust the duty cycle of the trailer brake control unit 214.

As shown in FIG. 3, the plug 4 includes a plug cover 6 and a plurality of terminals 10, 12, 14, 16, 18, 20 and 22 for connecting with a wireless testing device 30 in an embodiment. The wireless testing device 30 is configured to test the connector wiring of the vehicle 1. In particular, the wireless testing device 30 is configured to test the brake gain and detect the duty cycle, voltage and current of the electric brake circuit.

The wireless testing device 30 includes a connection portion 32 having a plurality of terminals 34, 36, 38, 40, 42, 44 and 46 configured to mate with respective terminals on the plug 4. For example, the terminal 34 of wireless testing device 30 is configured to connect with the terminal 10 of plug 4, the terminal 36 of wireless testing device 30 is configured to connect with the terminal 12 of plug 4, the terminal 38 of wireless testing device 30 is configured to connect with the terminal 14 of plug 4, the terminal 40 of wireless testing device 30 is configured to connect with the terminal 16 of plug 4, the terminal 42 of wireless testing device 30 is configured to connect with the terminal 18 of plug 4, the terminal 44 of wireless testing device 30 is configured to connect with the terminal 20 of plug 4, and the central terminal 46 of wireless testing device 30 is configured to connect with the central terminal 22 of plug 4.

Each of the terminals 10, 12, 14, 16, 18, 20 and 22 can be wired in parallel to an electrical supply line for conveying an electrical power to a circuit in the vehicle 1. For example, the terminal 10 may be configured to convey electrical power to the left turn and brake light of vehicle 1. The terminal 12 may be configured to convey electrical power to a ground connection. The terminal 14 may be configured to convey electrical power to an output of the electric brake/trailer brake control unit 214. The terminal 16 can be configured to convey electrical power to the right turn and brake light of vehicle 1. The terminal 18 may be configured to convey electrical power to a 12 Volt battery of vehicle 1. The terminal 20 can be configured to convey electrical power to a parking light of vehicle 1. The terminal 22 can be configured to convey electrical power to an auxiliary power supply of vehicle 1. However, it will be apparent to those skilled in the art from this disclosure that any one of the terminals 10, 12, 14, 16, 18, 20 and 22 can be configured to convey electrical power to any one of the left turn and brake light of vehicle 1, the ground connection, the output of the trailer brake control unit 214, the right turn and brake light of vehicle 1, the 12 Volt battery of vehicle 1, the park light of vehicle 1, and the auxiliary power supply of vehicle 1.

It will be apparent to those skilled in the art from this disclosure that the trailer connector may be configured to convey electrical power to suitable circuits other than those described above.

As shown in FIGS. 3-6, the wireless testing device 30 according to an embodiment includes a connector portion 32, a housing 50 and a lip 48 configured to allow the wireless testing device 30 to mate with the plug 4. The wireless testing device 30 is configured to have a size of 6"×3"×3" or less, in particular a size of 5.97"×2.14"×1.86". The wireless testing device 30 may also have a weight of 8 ounces or less, in particular a weight of 4.9 ounces. The connector portion 32 may be any suitable connector configured to connect to the terminals 10, 12, 14, 16, 18, 20 and 22 of plug 4. For example, the connector portion 32 may be a 7-way connector such as a Reese Part Number 85478 7-way connector.

Figure 4:
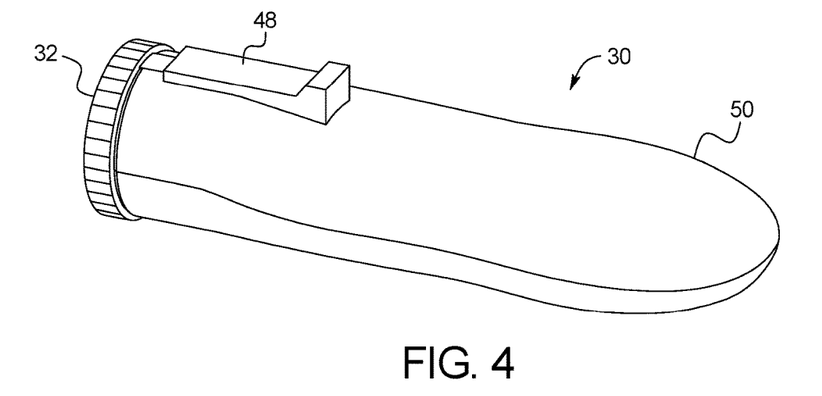
FIG. 4 is a top perspective view of the wireless testing device of FIG. 3B.
Figure 5:
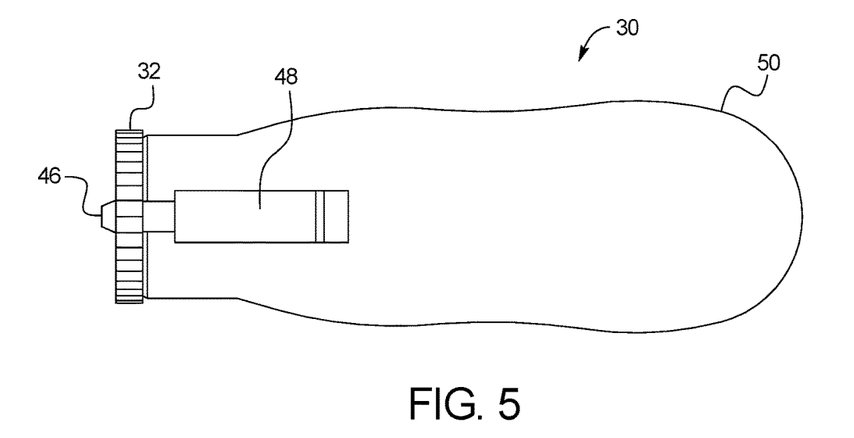
FIG. 5 is a top view of the wireless testing device shown in FIG. 3B.
Figure 6:
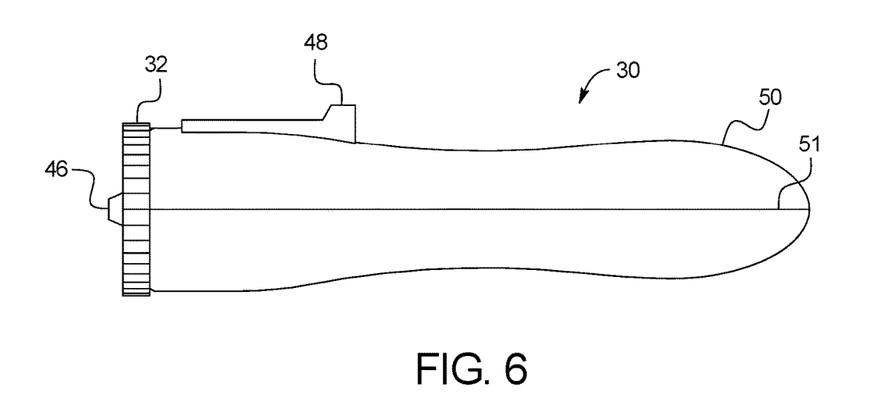
FIG. 6 is a right side elevational view of the wireless testing device shown in FIG. 3B.

The housing 50 may be formed of a urethane material. The housing is translucent so that LED lights in the wireless testing device 30 are visible through the housing 50. The housing 50 has a sufficient thickness to withstand a four-foot drop to a concrete floor. However, it will be apparent to those skilled in the art from this disclosure that the housing 50 may be formed of any suitable material other than urethane that can withstand a four-foot drop to a concrete floor or any other suitable material.

The lip 48 may be configured such that a label can be affixed to the surface of lip 48. For example, the lip 48 may be formed of a plastic material or any suitable material for applying or adhering a label thereto.

Figure 7:
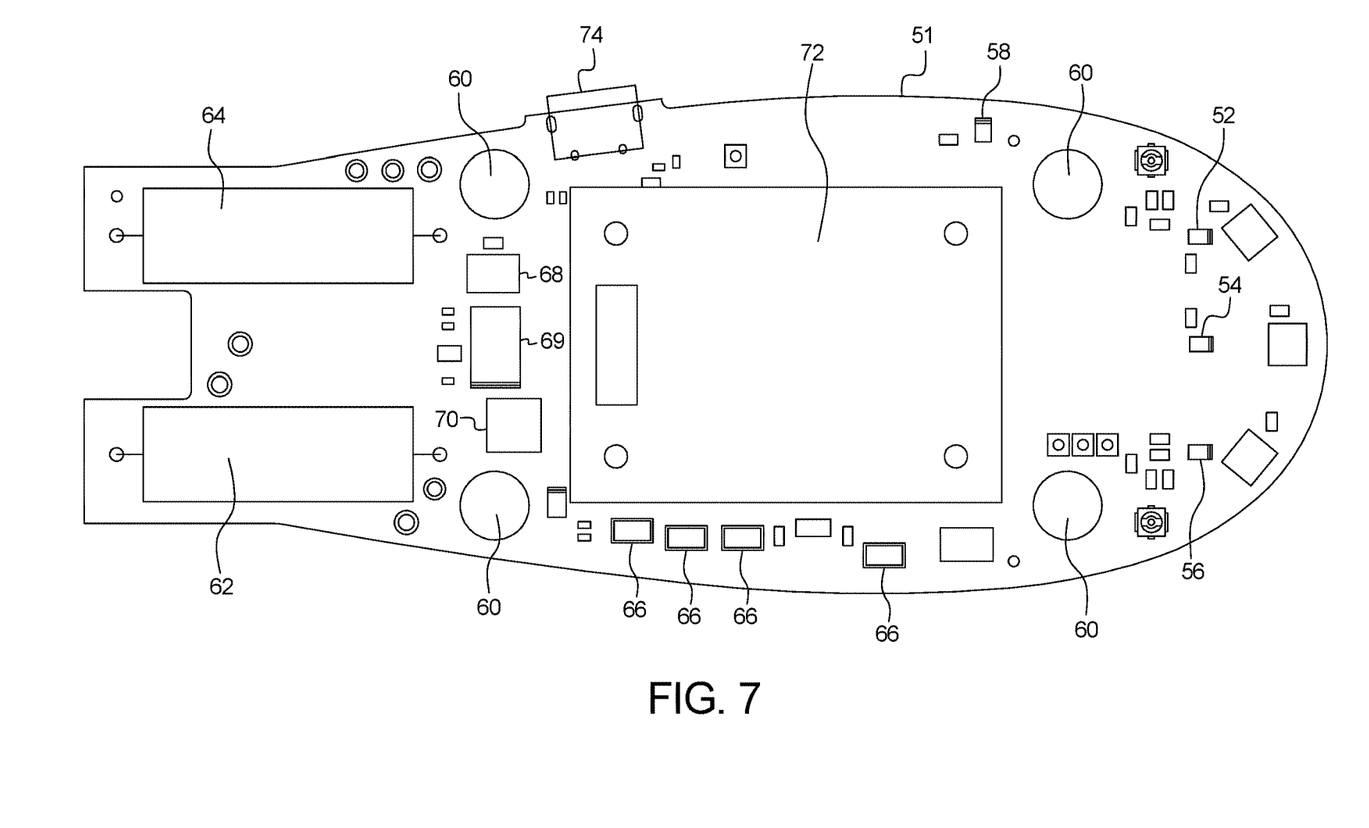
FIG. 7 is a top view of the circuit board of the wireless testing device shown in FIG. 3.

FIG. 7 shows a top side of a circuit board 51 of the wireless testing device 30. The circuit board 51 includes a red light emitting diode 52, a yellow light emitting diode 54, a green light emitting diode 56 and a blue light emitting diode 58. The circuit board 51 also includes a plurality of contacts 60, a plurality of test points 66, capacitors 68 and 69, an inductor 70, a microprocessor 72 and a thermal sensor 74.

The light emitting diodes 52, 54, 56 and 58 are used to indicate the status of the wireless testing device 30. For example, the yellow light emitting diode 54 can flash during initialization of the procedure for testing the connector wiring of the vehicle 1. The green light emitting diode 56 can flash when the wireless testing device 30 is ready to receive commands. The blue light emitting diode 58 can flash when the wireless testing device 30 connects to the plug 4 via RF. The blue light emitting diode 58 then maintains a steady on state when RF authentication is achieved. The red light emitting diode 52 is configured to flash red when a temperature of the thermal sensor 74 measures above 40° C.

Figure 8:
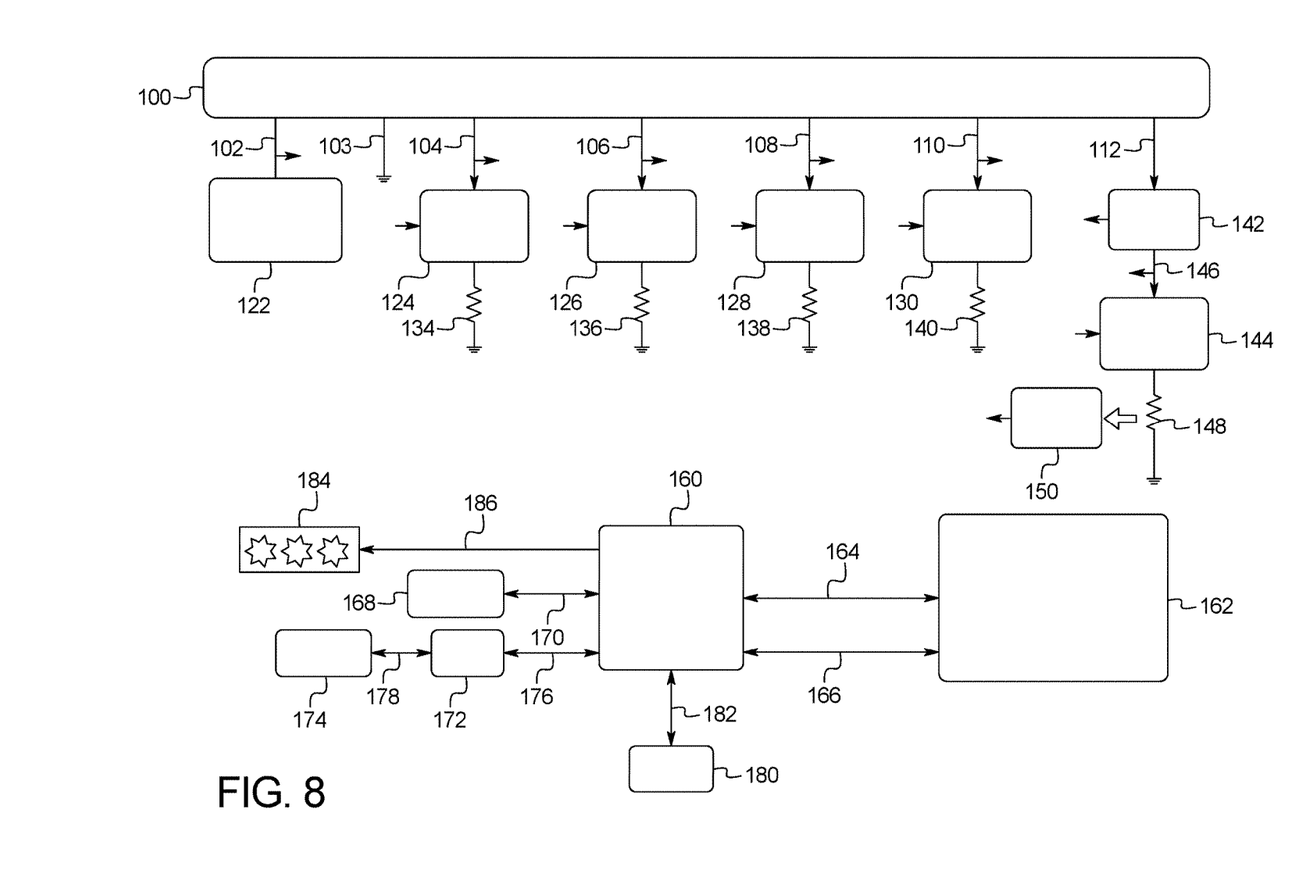
FIG. 8 is a block diagram of the components of a wireless testing device according to an embodiment.

Referring now to FIG. 8, the wireless testing device 30 in accordance with an embodiment will be explained. As shown in FIG. 8, the wireless testing device 30 includes a 7-way trailer connector 100. The trailer connector 100 can be a connector portion 32 as illustrated in FIG. 3A. The 7-way trailer connector 100 includes seven terminals or inputs that are each connected to wires 102, 103, 104, 106, 108, 110 and 112. The terminals of the connector 100 are each configured to connect to terminals 10, 12, 14, 16, 18, 20 and 22 of plug 4 and correspond to various circuits in the vehicle 1.

For example, as shown in FIG. 8, the terminal connected to wire 102 is a battery input and corresponds to the 12 Volt battery circuit in the vehicle 1. The terminal connected to wire 103 is a ground input and corresponds to the ground connection. The terminal connected to wire 104 is a parking light input and corresponds to the parking light circuit in the vehicle 1. The terminal connected to wire 106 is a left turn and brake input and corresponds to the left turn and brake light circuit of vehicle 1. The terminal connected to wire 108 is a right turn and brake input and corresponds to the right turn and brake light circuit of vehicle 1. The terminal connected to wire 110 is an auxiliary input and corresponds to the auxiliary power supply circuit of vehicle 1. The terminal connected to wire 112 is an electric brake input and corresponds to the output of the electric brake/trailer brake control unit 214. As with connector portion 32, the terminals of connector 100 are each configured to be electrically connected with the corresponding circuit in the vehicle when connector 100 is plugged into plug 4.

The battery input is connected to a switching regulator 122 through wire 102. The switching regulator 122 can be a LT3480 step-down switching regulator with an input operating range of 3.6 V-36 V, a maximum output voltage of 3.3 V and a maximum output current of 2 A. The ground input is connected to a ground point through wire 103. The parking light input, the left turn and brake light input, the right turn and brake input and the auxiliary input are each connected to load switches 124, 126, 128 and 130, respectively, through wires 104, 106, 108 and 110. Each of the load switches 124, 126, 128 and 130 is respectively connected to resistors 134, 136, 138 and 140. Each of the load switches 124, 126, 128 and 130 may be a FDC632 4L load switch with a maximum output current of 1.5 A. However, it will be apparent to those skilled in the art from this disclosure that load switches 124, 126, 128 and 130 may be any suitable load switch and may be the same load switch or different load switches. Each of the resistors 134, 136, 138 and 140 may be 1.2k Ohm resistors. However, it will be apparent to those skilled in the art from this disclosure that resistors 134, 136, 138 and 140 may be any suitable resistor.

The electric brake input is connected to a Hall effect sensor 142 through wire 112. Hall effect sensor 142 is connected to a power switch 144 through wire 146, and power switch 144 is connected to a resistor 148. A thermal sensor 150 is also provided to monitor the temperature of resistor 148. The resistor 148 may be a 3.75 Ohm resistor. However, it will be apparent to those skilled in the art from this disclosure that the resistor 148 may be any suitable resistor. The Hall effect sensor 142 may be an ACS711 Hall effect linear current sensor, but it will be apparent to those skilled in the art from this disclosure that any suitable current sensor may be used in place of the Hall effect sensor 142. The power switch 144 may be a BTT6020 7A power switch, but it will be apparent to those skilled in the art from this disclosure that any suitable power switch may be used as the power switch 144. The thermal sensor 150 may be a TC77 thermal sensor, but any suitable thermal sensor may be used to monitor the temperature of the resistor 148.

As shown in FIG. 8, wireless testing device 30 also includes a microprocessor 160. The microprocessor 160 may be a ARM7 LPC1788 processor, but it will be apparent to those skilled in the art that any suitable microprocessor may be used as the processor 160. The microprocessor 160 is connected to a wireless communication module 162 through universal asynchronous receiver/transmitters 164 and 166. The universal asynchronous receiver/transmitter 164 has a speed of 921 kbps, and the universal asynchronous receiver/transmitter 166 has a speed of up to 921 kbps. The wireless communication module 162 may be an 802.11 a/b/g/n radio module with Enterprise Class Security, but it will be apparent to those skilled in the art from this disclosure that any suitable wireless communication module may be used as wireless communication module 162 as long as it enables the wireless testing device 30 to communicate wirelessly.

The microprocessor 160 is connected to a micro A/B connector 168 through a USB wire 170. The microprocessor 160 is also connected to a transceiver 172 through wire 176. The transceiver 172 may be an RS-232 transceiver, but it will be apparent to a skilled artisan that any suitable transceiver may be used as transceiver 172. The transceiver 172 is also connected to a CON-527 ISP Header 174 through wire 178. The microprocessor 160 is further connected to a CON-601 JTAG connector 180 through wire 182. The microprocessor 160 is also connected to light emitting diodes 184 through a discrete wire 186. Light emitting diodes 184 may provide status information on the wireless testing device 30 when it is connected to plug 4 and/or may indicate the individual lights that would operate on a trailer connected to the vehicle 1 in order to visually confirm operation of each light as an observer would be able to on a trailer that is actually attached to the vehicle 1.

For example, in an embodiment, a yellow light emitting diode 184 is configured to flash during initialization of the procedure for testing the connector wiring of the vehicle 1 with the wireless testing device 30. A green light emitting diode 184 is configured to flash when the wireless testing device 30 is ready to receive commands. A blue light emitting diode 184 is configured to flash when the wireless testing device 30 connects to the plug 4 via RF. The blue light emitting diode 184 may also be configured to turn solid and stop flashing when RF authentication is achieved. A red light emitting diode 184 may be configured to flash red when a temperature of a thermal sensor 150 measures above 40° C.

The microprocessor 160 is configured to determine the operability of the parking light circuit, the left turn and brake light circuit, the right turn and brake light circuit, the auxiliary power supply circuit and the electric brake circuit of vehicle 1 when connector 100 is plugged into plug 4. For example, the microprocessor 160 is configured to receive a command from the wireless communication module 162 and apply the 1.2k Ohm load from resistor 134 to the parking light circuit of vehicle 1. In an embodiment, one of the light emitting diodes 184 is configured to indicate that the parking light circuit of vehicle 1 is operable. Similarly, the microprocessor 160 is configured to receive commands from the wireless communication module 162 and apply the 1.2k Ohm loads from resistors 136, 138 and 140 to the left turn and brake light circuit, the right turn and brake light circuit, and the auxiliary power supply circuit, respectively, of the vehicle 1. In an embodiment, the light emitting diodes 184 may be configured to indicate the operability of each of the left turn and brake light circuit, the right turn and brake light circuit, and the auxiliary power supply circuit of the vehicle 1.

The microprocessor 160 is also configured to receive a command from the wireless communication module 162 and apply the 3.75 Ohm load from resistor 148 to the electric brake circuit. In this manner, the wireless testing device 30 may test a brake gain and/or detect a duty cycle, voltage or current of the trailer brake control unit 214 of the vehicle 1 to confirm the operability of the trailer brake control unit 214.

The microprocessor 160 preferably includes a microcomputer with a control program that controls the application of loads from the resistors 134, 136, 138, 140 and 148 as discussed above. The microprocessor 160 can also include other conventional components such as an input interface circuit, an output interface circuit, and storage devices such as a ROM (Read Only Memory) device and a RAM (Random Access Memory) device. The memory circuit stores processing results and control programs such as ones for microprocessor 160 operation that are run by the processor circuit. The microprocessor 160 is operatively coupled to the 7-way trailer connector 100 in a conventional manner. The internal RAM of the microprocessor 160 stores statuses of operational flags and various control data. The internal ROM of the microprocessor 160 stores information necessary for various operations. The microprocessor 160 is capable of selectively controlling any of the components of the control system in accordance with the control program. It will be apparent to those skilled in the art from this disclosure that the precise structure and algorithms for the microprocessor 160 can be any combination of hardware and software that will carry out the functions of the present invention.

The wireless testing device 30 is configured to have an input voltage ranging from about 5.0 Vdc to about 18.0 Vdc. The wireless testing device 30 is configured to receive primary power from a battery and secondary power via the USB wire 170.

The ARM7 LPC1788 processor and the 802.11 a/b/g/n radio module with Enterprise Class Security are conventional components that are well known in the art. As such, these structures will not be discussed or illustrated in detail herein. Rather, it will be apparent to those skilled in the art from this disclosure that the components can be any type of structure and/or programming that can be used to carry out the present invention.

Figure 9:
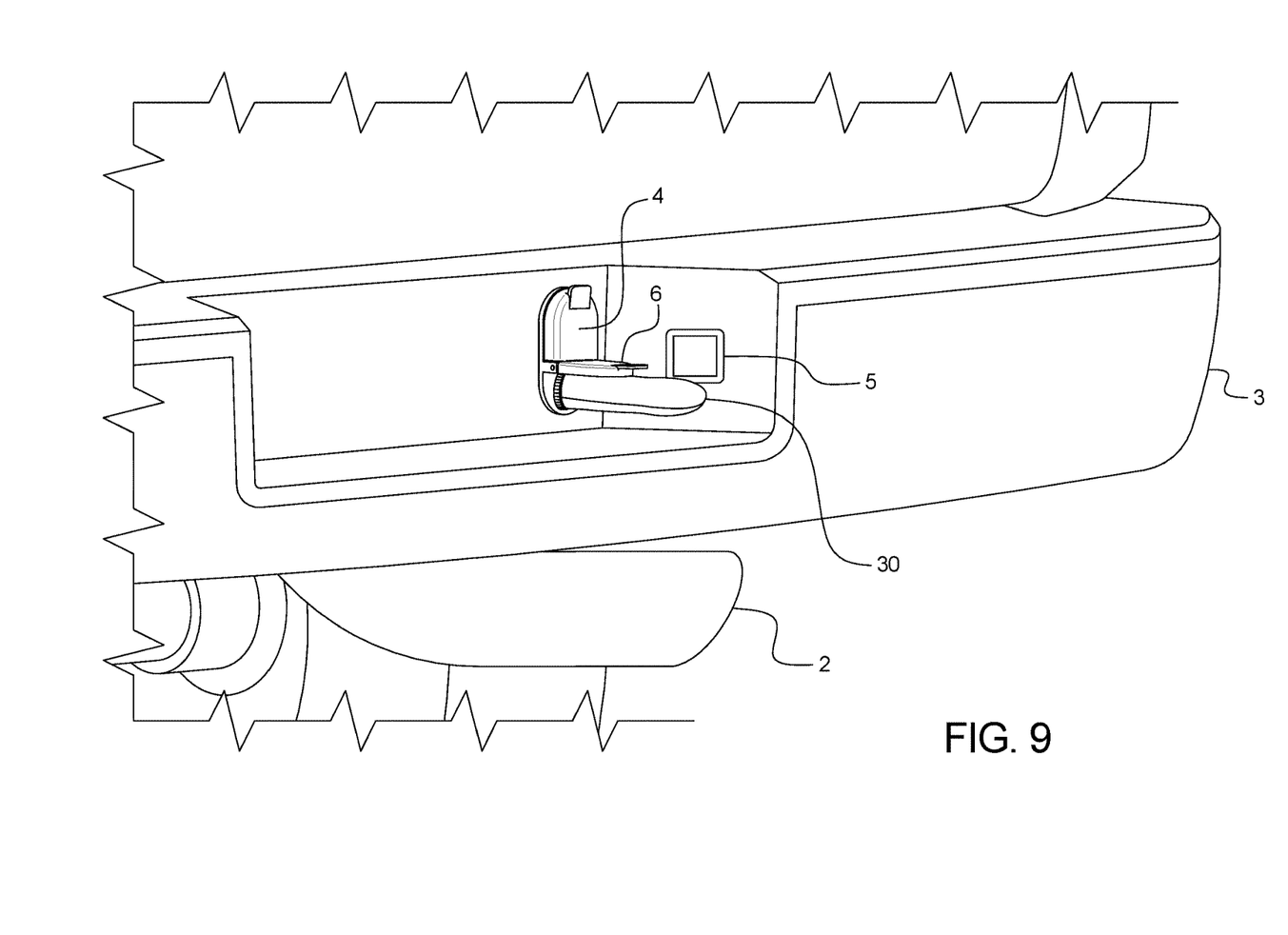
FIG. 9 is a rear perspective view of the vehicle of FIG. 1 including a wireless testing device connected to the wiring connector on the rear bumper according to an embodiment.
Figure 10:
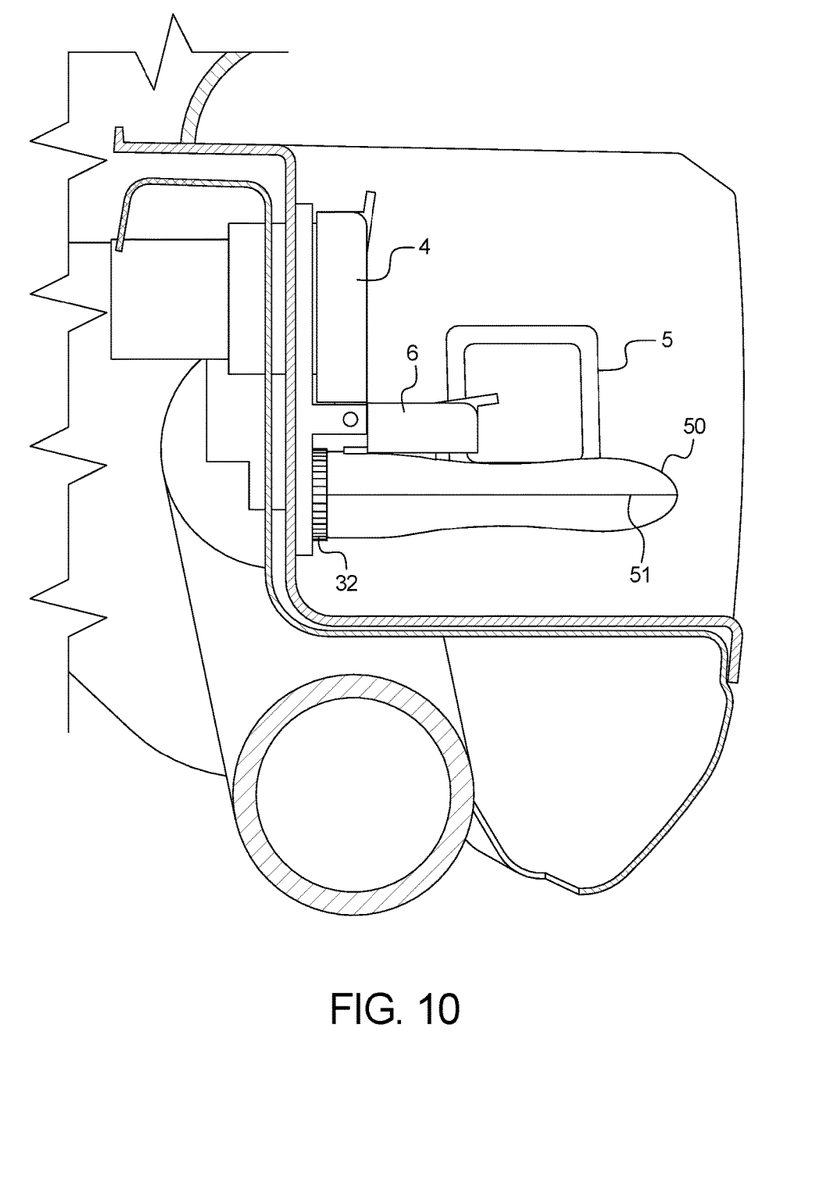
FIG. 10 is a left side view of the vehicle of FIG. 9 including the wireless testing device connected to the wiring connector on the rear bumper.

FIGS. 9-13 show a wireless trailer testing system in accordance with an embodiment. As shown in FIGS. 9 and 10, the wireless trailer testing system includes the wireless testing device 30 described above. During operation of the wireless trailer testing system, the wireless testing device 30 is plugged into plug 4 on the rear bumper 3 of the vehicle 1.

Figure 11:
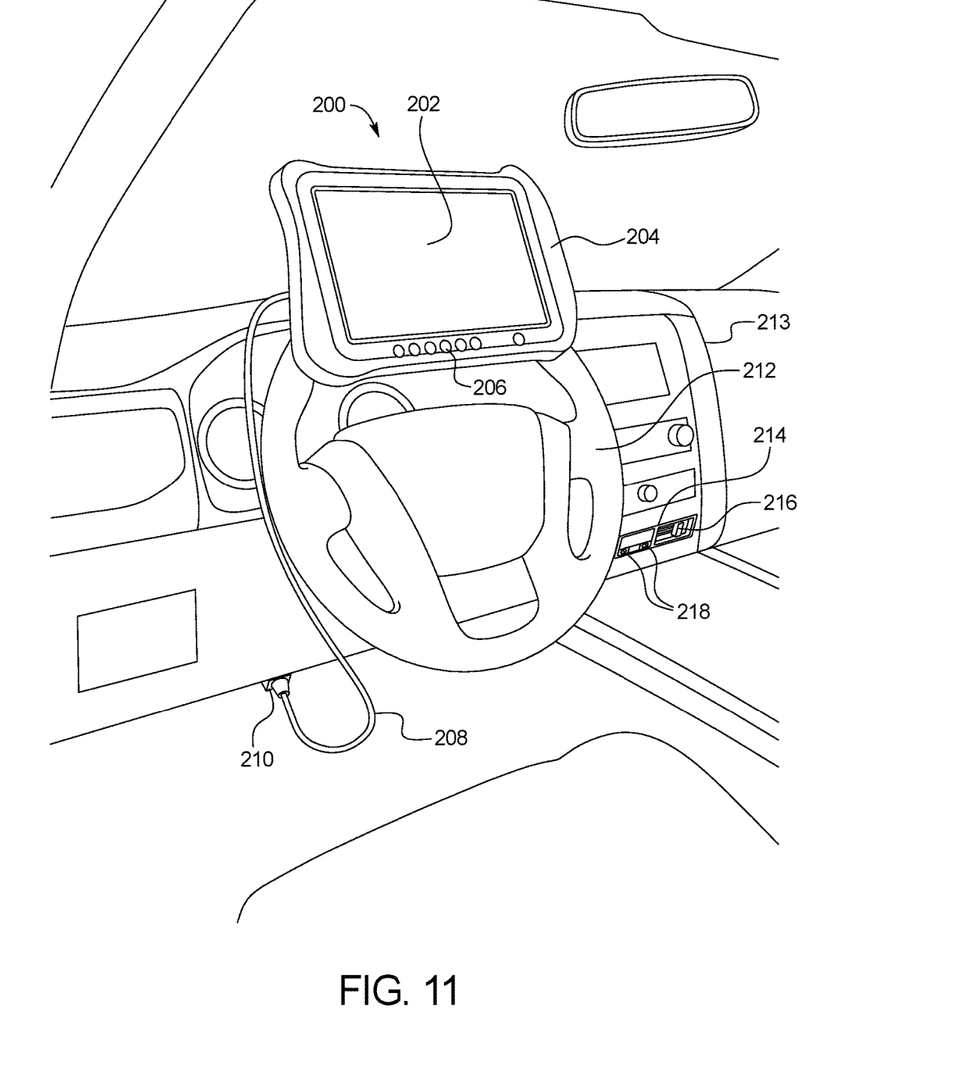
FIG. 11 is a perspective view of a portable test unit connected to an on-board diagnostic system of a vehicle according to an embodiment.
Figure 12:
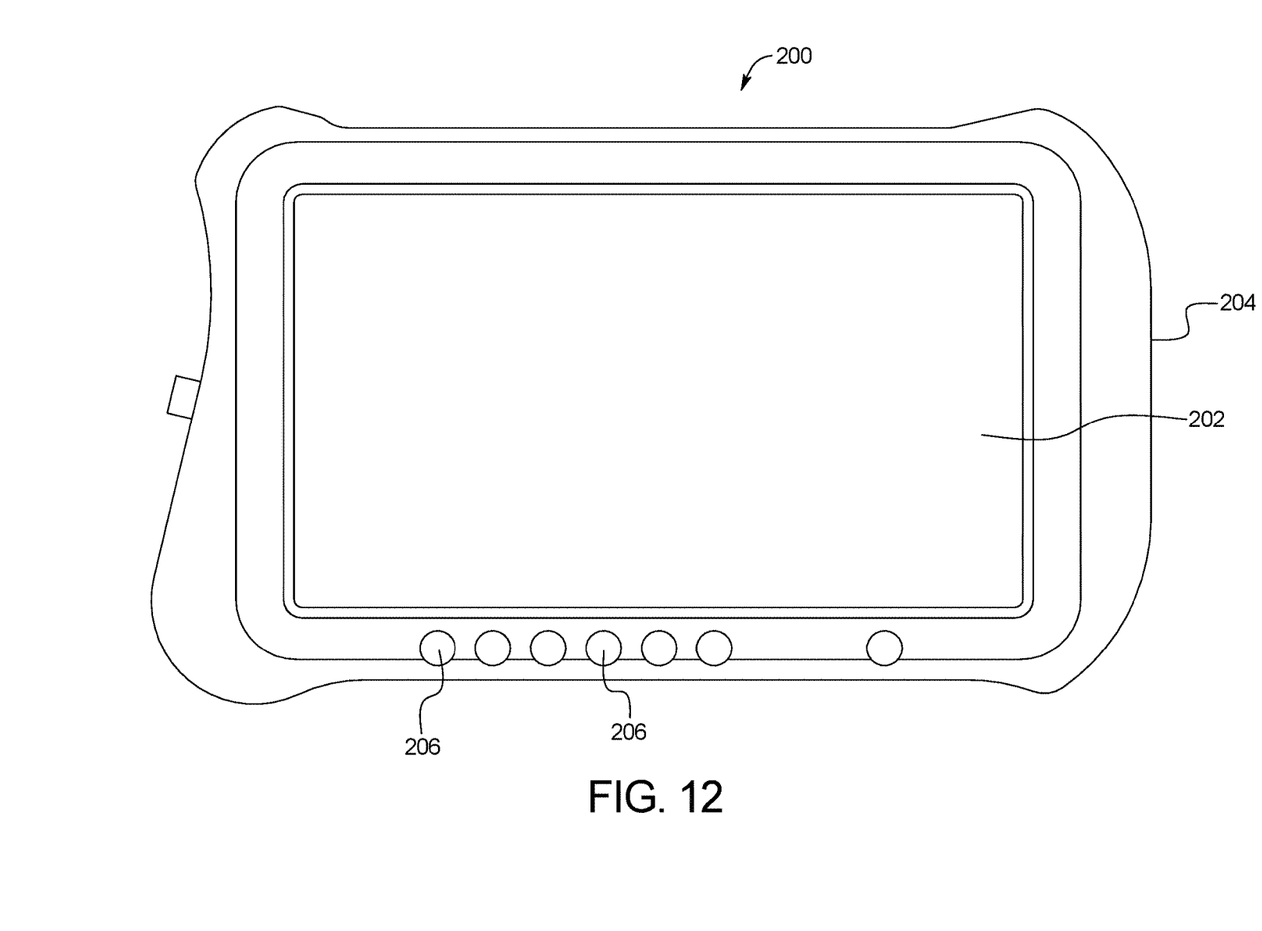
FIG. 12 is a front view of the portable test unit of FIG. 11.
Figure 13:
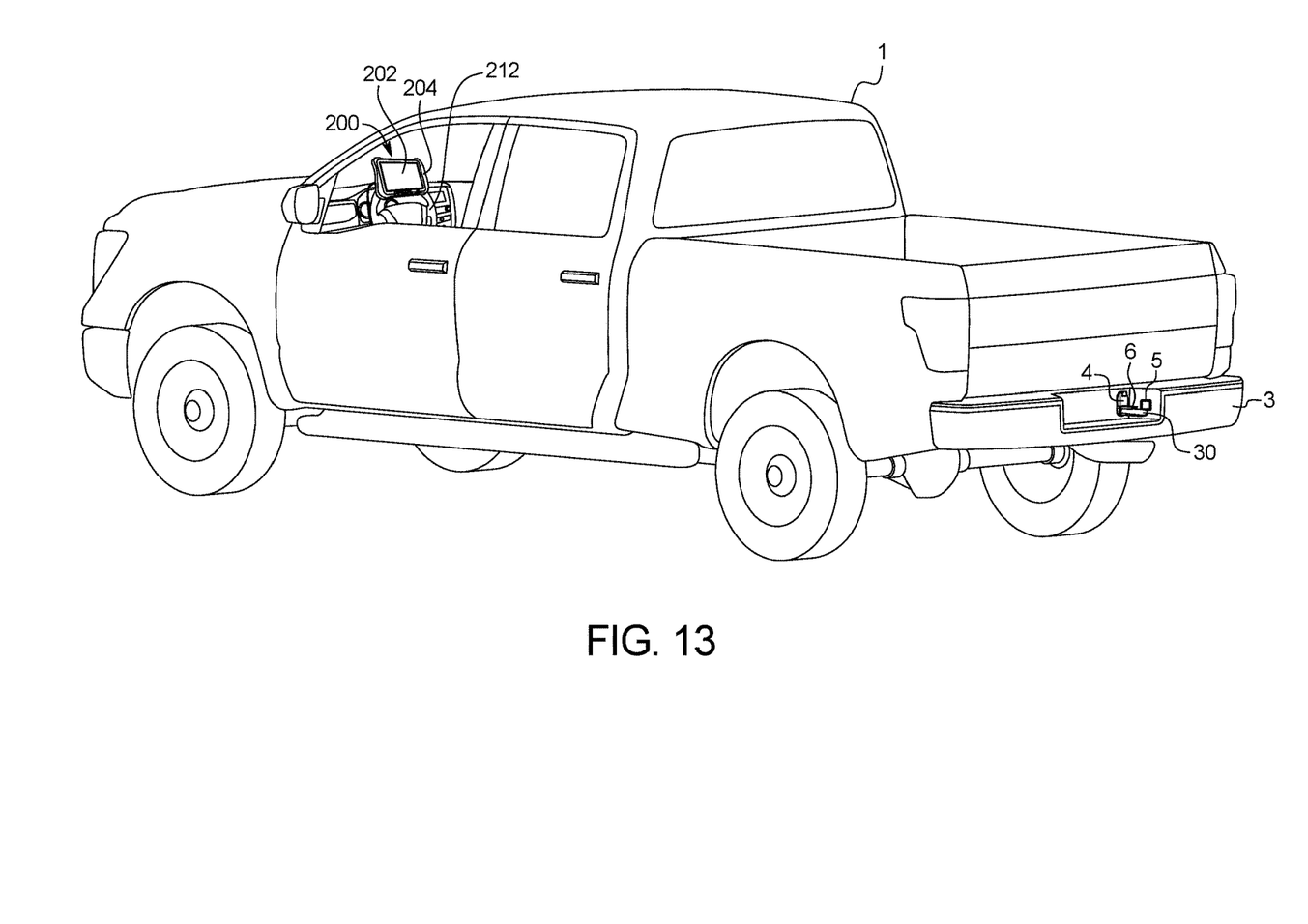
FIG. 13 is a perspective view of a wireless trailer testing system.

The wireless trailer testing system also includes a tester 200 configured to be mounted on a steering wheel 212 of the vehicle 1. As shown in FIGS. 11-13, the tester 200 is a tablet including a display 202, a frame 204, buttons 206 and a cable 208. The tester 200 is configured to connect to an on-board diagnostic system 210 of the vehicle 1 via the cable 208. The tester 200 may be a portable tablet or computer including a wireless interface tool (not shown). The tester 200 is configured to communicate with the wireless communication module 162 of the wireless testing device 30 using the wireless interface tool. The display 202 may include a graphical user interface that allows a user to input or select various commands. These commands are then sent to the wireless communication module 162 of the wireless testing device 30 using the wireless interface tool.

In an embodiment, the wireless communication module 162 of the wireless testing device 30 is configured to receive a command from the wireless interface tool of the tester 200. The command is then sent to the microprocessor 160 from the wireless communication module 162. In response to the command from the tester 200, the microprocessor 160 is configured to apply one of the loads from resistors 134, 136, 138, 140 and 148 to the corresponding circuit of the vehicle 1 (i.e., the parking light circuit, the left turn and brake light circuit, the right turn and brake light circuit, the auxiliary power supply circuit and the electric brake circuit).

Figure 14:
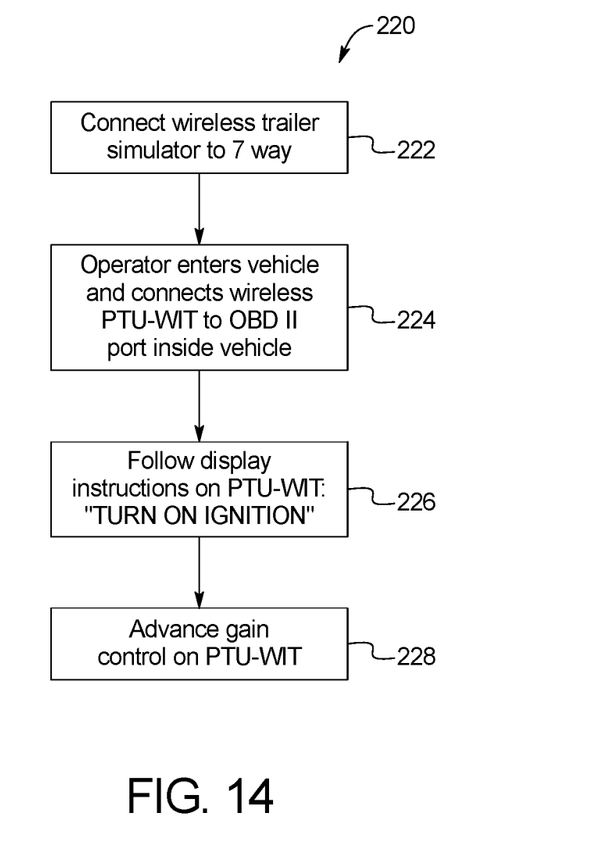
FIG. 14 is a flow diagram illustrating a method for testing a trailer brake control unit of a vehicle according to an embodiment.

FIG. 14 describes a method 220 for testing a trailer brake control unit of a vehicle in an embodiment. In step 222, an operator connects a wireless trailer simulator to a 7-way connector on the rear bumper 3 of the vehicle 1. The wireless trailer simulator may be the wireless testing device 30, and the 7-way connector may be plug 4. In step 224, the operator enters the vehicle and connects the tester 200 to the on-board diagnostic port 210 inside the vehicle 1. The tester 200 may be a portable tablet with a wireless interface tool as described above. The operator may connect the tester 200 to the on-board diagnostic port 210 using the cable 208 as shown in FIG. 11.

In step 226, the operator follows the display instructions on display 202 of tester 200. When issuing instructions, the display 202 should indicate that the tester 200 is connected to the on-board diagnostic port 210 and the wireless trailer simulator is connected to the vehicle 1. For example, the display 202 indicates "TURN ON IGNITION TO RUN POSITION." The operator then turns on the ignition of the vehicle 1 in response to the instructions on display 202. The display 202 may then indicate "ADVANCE OR SLIDE GAIN CONTROL FULLY TO THE RIGHT OR FULL BRAKE POSITION." In response, the operator moves the lever 216 on the trailer brake control unit 214 to full gain in step 228. The tester 200 communicates with the wireless testing device 30 to verify that the full gain is working correctly, the tester 200 records the results and the display 202 reads "10" if the trailer brake control unit 214 is working properly.

The display 202 may then indicate "ADVANCE OR SLIDE GAIN CONTROL FULLY TO THE LEFT OR ZERO POSITION." The operator then moves the lever to zero gain, the tester 200 records to the results and the display reads "0." The tester 200 communicates with the wireless testing device 30 to verify that the zero gain is working correctly, the tester 200 records the results and the display 202 reads "0" if the trailer brake control unit 214 is working properly.

The display 202 then indicates "ADVANCE RIGHT TURN SIGNAL." The operator advances the right turn signal, and the tester 200 communicates with the wireless testing device 30 to verify that the right turn signal is working correctly. The display 202 then indicates whether the right turn signal is okay. Once the right turn signal is active, the display indicates "ADVANCE LEFT TURN SIGNAL." The operator advances the left turn signal, and the tester 200 communicates with the wireless testing device 30 to verify that the left turn signal is working correctly. The display 202 then indicates whether the left turn signal is okay.

The display 202 then instructs the operator to test the brake signals. For example, the display 202 states "PRESS BRAKE PEDAL." The operator presses the brake pedal, and the tester 200 communicates with the wireless testing device 30 to verify that the brake pedal is working correctly. The display 202 then indicates whether the brake pedal is okay. Once the brake signal is active, the display 202 states "PUT SHIFTER IN REVERSE POSITION." The operator puts the gear shift in the reverse position, and the tester 200 communicates with the wireless testing device 30 to verify that the parking light is working correctly. The display 202 then indicates whether the parking light is okay.

Once the brake signal test is complete, the display 202 will provide an overall indication of whether the trailer test is okay.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a Device, System and Method for Wirelessly Testing Trailer Brake Control Unit. Accordingly, these terms, as utilized to describe the present invention should be interpreted relative to a Device, System and Method for Wirelessly Testing Trailer Brake Control Unit.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A wireless testing device comprising:
a housing having only a single connection side, so as to be connectable to a vehicle, and being separate from a trailer;
a trailer connector portion disposed at the single connection side of the housing and comprising a plurality of inputs configured to connect to a plurality of circuits in the vehicle;
a communication device configured to communicate with a tester, the tester configured to display instructions to test aspects of the plurality of circuits in the vehicle;
a plurality of loads each connected to one of the plurality of inputs; and
a control device configured to determine the operability of each of the plurality of circuits in the vehicle in conjunction with the instructions on the tester when the trailer connector portion is connected to the vehicle by applying each of the plurality of loads to a respective one of the plurality of inputs.

2. The wireless testing device according to claim 1, wherein the communication device is configured to communicate wirelessly with the tester, the tester being connected to an on-board diagnostic system of the vehicle.

3. The wireless testing device according to claim 1, wherein each of the plurality of loads is a switch controlled load.

4. The wireless testing device according to claim 1, wherein the control device is a microprocessor.

5. The wireless testing device according to claim 1, wherein the wireless testing device has an input voltage ranging from about 5.0 Vdc to about 18.0 Vdc.

6. The wireless testing device according to claim 1, wherein the plurality of inputs includes an electric brake input and the load connected to the electric brake input is a 3.75 ohm load.

7. The wireless testing device according to claim 1, comprising at least two lights.

8. A wireless trailer testing system for a vehicle comprising:
- a tester configured to connect to an on-board diagnostic system of the vehicle, configured to display instructions for testing of the plurality of circuits in the vehicle, and configured to transmit commands based on the instructions displayed; and
- a wireless testing device comprising:
- a trailer connector portion comprising a housing having only a single connection side, so as to be connectable to the vehicle, and a plurality of inputs disposed on the single connection side of the housing and configured to connect to a plurality of circuits in the vehicle, the trailer connector portion being separate from a trailer;
- a communication device configured to communicate wirelessly with the tester;
- a plurality of loads each connected to one of the plurality of inputs; and
- a control device configured to determine the operability of each of the plurality of circuits in the vehicle when the trailer connector portion is connected to the vehicle by applying each of the plurality of loads to one of the plurality of inputs,
- the control device configured to apply each of the plurality of loads connected to a respective one of the plurality of inputs based on the commands received from the tester.

9. The wireless trailer testing system according to claim 8, wherein each of the plurality of loads is a switch controlled load.

10. The wireless trailer testing system according to claim 8, wherein the control device is a microprocessor.

11. The wireless trailer testing system according to claim 8, wherein the wireless testing device comprises at least two lights.

12. The wireless trailer testing system according to claim 8, wherein the tester comprises a portable test unit and a wireless interface tool.

13. The wireless trailer testing system according to claim 12, wherein the wireless interface tool includes a graphical user interface.

14. A method for testing a trailer brake control unit of a vehicle, the method comprising:
- connecting a wireless testing device to a plurality of circuits in the vehicle, the wireless testing device comprising:
- a trailer connector portion comprising a plurality of inputs only on a single side, so as to be only connectable to the vehicle, the trailer connector portion being separate from a trailer and configured to connect to a plurality of circuits in the vehicle;
- a communication device configured to communicate wirelessly with a tester;
- a plurality of loads each connected to one of the plurality of inputs; and
- a control device configured to determine the operability of each of the plurality of circuits in the vehicle when the trailer connector portion is connected to the vehicle by applying each of the plurality of loads to one of the plurality of inputs;
- connecting the tester to an on-board diagnostic system of the vehicle, the tester displaying instructions for testing of the plurality of circuits in the vehicle, and transmitting commands based on the instructions displayed;
- determining, via the control device, the operability of each of the plurality of circuits in the vehicle when the trailer connector portion is connected to the vehicle based on the commands from the tester, by applying each of the plurality of loads connected to a respective one of the plurality of inputs based on the commands received from the tester.

15. The method according to claim 14, wherein each of the plurality of loads is a switch controlled load.

16. The method according to claim 14, wherein the wireless testing device comprises at least two lights.

17. The method according to claim 14, wherein the tester comprises a portable test unit and a wireless interface tool.

18. The method according to claim 17, wherein the wireless interface tool includes a graphical user interface.

19. The method according to claim 17, wherein the tester is a tablet.

* * * * *